Nov. 1, 1966 H. B. MOORE 3,283,075

LOAD CIRCUITS FOR INTERCOMMUNICATION SYSTEM

Filed March 26, 1963

INVENTOR:
HARWOOD B. MOORE,

BY Norman C. Fulmer
HIS ATTORNEY.

United States Patent Office 3,283,075

Patented Nov. 1, 1966

3,283,075

LOAD CIRCUITS FOR INTERCOMMUNICATION SYSTEM

Harwood B. Moore, Sauquoit, N.Y., assignor to General Electric Company, a corporation of New York Filed Mar. 26, 1963, Ser. No. 267,976
3 Claims. (Cl. 179—1)

Figures 1, 2, 3:
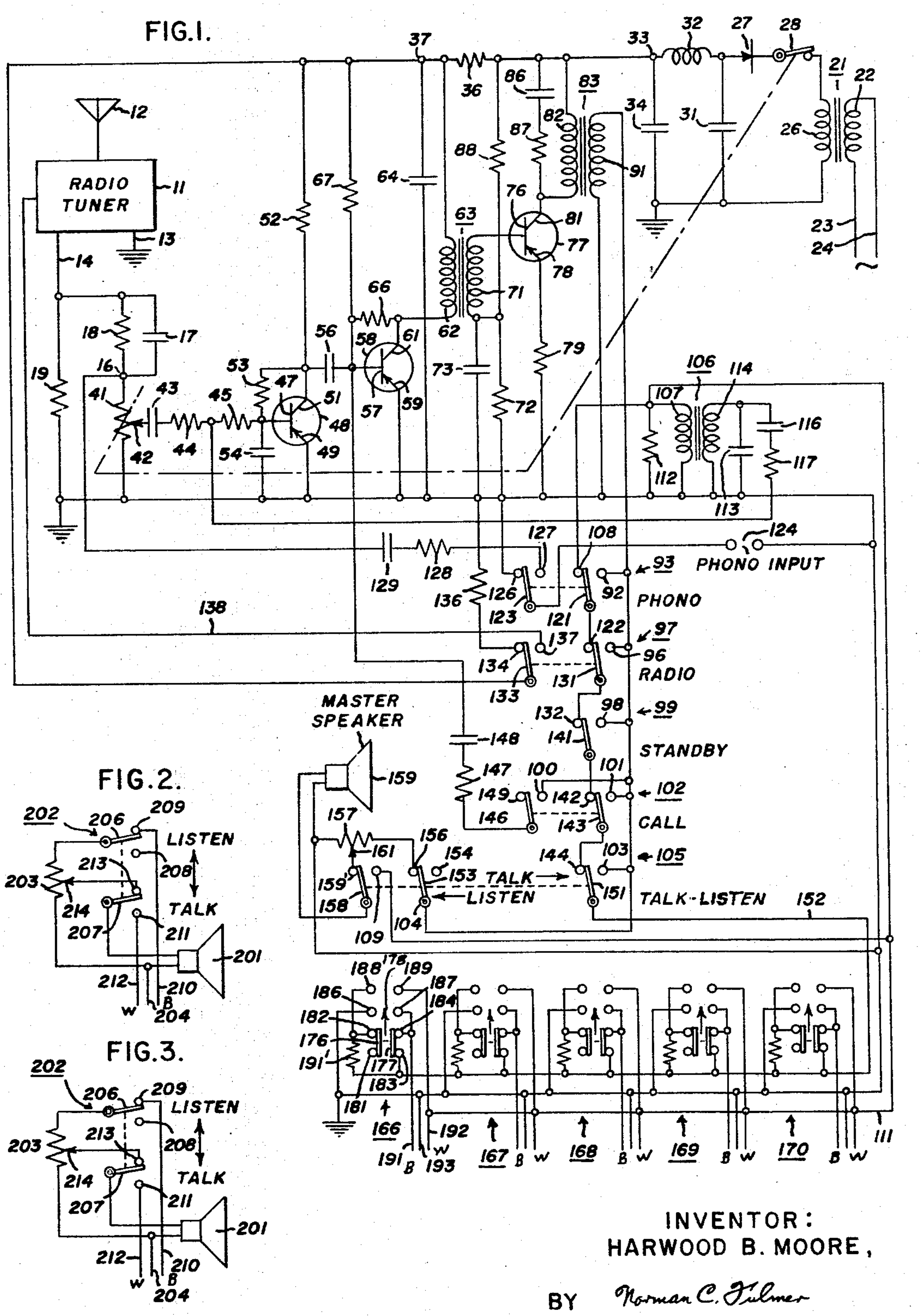

This invention relates to intercommunication systems, commonly called "intercoms," used in homes and elsewhere, and particularly relates to a load circuit arrangement for providing a substantially constant electrical load at the output of the audio amplifier of the system irrespective of the number of stations connected to the amplifier.

Intercommunication systems usually have a switching arrangement, at the "master" station, for selectively turning various "remote" stations on and off for the reception of signals from the master station. When a relatively large number of these remote stations are in the "on" condition, their collective impedance across the output of the audio amplifier is relatively low, and when only a few or none of the remote stations are "on," their collective impedance is relatively high. This variation of impedance load on the audio amplifier causes undesirable changes in volume level, frequency response, distortion, and other characteristics of the system, when different numbers of remote stations are in the "on" condition.

An object of the invention is to provide an intercommunication system with a load circuit arrangement for maintaining substantially constant electrical loading on the audio amplifier.

Other objects will be apparent from the following description and claims, and from the drawing in which:

FIG. 1 is a schematic diagram of a "master" station of the system, in accordance with a preferred embodiment of the invention; and FIGS. 2 and 3 are schematic diagrams of identical "remote" stations of the system.

The invention comprises, basically and in its preferred embodiment, an intercommunication system having means adapted to selectively connect various numbers of stations to the output of a signal source such as an audio amplifier, and means to connect a substitute load impedance to the output of the signal source whenever stations are disconnected therefrom, said substitute load impedance having a value of impedance substantially equal to the collective impedance of the disconnected stations. The invention furthermore comprises, in a specific preferred embodiment, an intercommunication system having a plurality of switches for selectively connecting various stations to the output of a signal source such as an audio amplifier, each switch being adapted to connect a substitute load impedance to the output of the signal source in lieu of the respective station when in the station-disconnecting position.

The drawing shows a schematic diagram of a complete intercommunication system, of which the present invention comprises the substitute load resistors 191, the control switches 166 through 170, and the associated circuitry.

Now referring to FIG. 1 of the drawing, a preferred circuit of a master station for an intercommunication system in accordance with the invention, may comprise a radio tuner 11, which may be an AM, FM, or combined AM-FM radio tuner. An antenna 12 may be connected to the tuner, and the audio signal output of the tuner comprises an electrically grounded connection 13 and an output connection 14 connected to an audio amplifier input terminal 16 via a parallel combination of a capacitor 17 and a resistor 18, the tuner output terminal 14 also being connected to electrical ground via a resistor 19, if desired. The resistor 18 provides electrical impedance isolation of the tuner 11 from the amplifier input terminal 16, to permit a phonograph signal to be applied to the terminal 16 as will be described, and also reduces the amplitude of the tuner output signal to a value approximately equal to the signal amplitude of conventional record players. The capacitor 17 improves the high-frequency region of the tuner audio output signal, by relatively increasing its amplitude.

A power supply for the circuit may comprise a transformer 21 having a primary winding 22 adapted to be connected to a suitable source of alternating current by means of wires 23 and 24, and having a secondary winding 26 having one end thereof connected to electrical ground, and having a rectifier 27 connected to the other end thereof via an on-off switch 28. A filter condenser 31 is connected between the output lead of the rectifier 27 and electrical ground, and a filter inductance 32 is connected between the output terminal of the rectifier 27 and a voltage output terminal 33 of the power supply, a further filter condenser 34 being connected between the terminal 33 and electrical ground. A filter resistor 36 is connected between the terminal 33 and a terminal 37 for reduced power supply output voltage. The rectifier 27 is connected with proper polarity to provide proper operating voltage polarity at the terminals 33 and 37.

An amplifier volume control potentiometer 41 is connected between the audio amplifier input terminal 16 and electrical ground. An adjustable tap 42 is provided on the potentiometer 41, and is mechanically coupled to the switch 28 for turning the switch 28 off when the tap 42 is at the electrical ground end of the potentiometer 41. A capacitor 43 and two resistors 44 and 45 are connected in series, as shown, between the tap 42 and a base electrode 47 of a first transistor 48. An emitter electrode 49 of the transistor 48 is electrically grounded, and a collector electrode 51 is connected to the voltage terminal 37 via a resistor 52. A biasing resistor 53 is connected between the base electrode 47 and the collector electrode 51, and a capacitor 54 is connected between the base electrode 47 and electrical ground, if required, to filter out any undesired radio-frequency signals which might otherwise become inadvertently detected and amplified in the amplifier.

A coupling capacitor 56 is connected between the collector electrode 51, and a base electrode 57, of a second transistor 58. An emitter electrode 59 of transistor 58 is electrically grounded, and a collector electrode 61 is connected to the voltage terminal 37 via a primary winding of a transformer 63. A filter capacitor 64 is connected between the voltage terminal 37 and electrical ground. A biasing resistor 66 is connected between the base and collector electrodes 57 and 61 of transistor 58, and a further biasing resistor 67 is connected between the base electrode 57 and the voltage terminal 37.

A secondary winding 71 of the transformer 63 has an end thereof connected to electrical ground via a biasing network comprising a parallel combination of a resistor 72 and a capacitor 73, and the other end thereof is connected to a base electrode 76 of a third transistor 77. An emitter electrode 78 of the transistor 77 is connected to electrical ground via a resistor 79 for providing bias and negative feedback, and a collector electrode 81 is connected to the voltage terminal 33 via a primary winding 82 of a transformer 83. A series combination of a capacitor 86 and a resistor 87, is connected between the voltage terminal 33 and the collector electrode 81, in order to protect the transistor 77 from high-frequency overload, and a biasing resistor 88 is connected between the voltage terminal 33 and the lower end of the secondary winding 71 of transformer 63.

A secondary winding 91 of the transformer 83 has an end thereof electrically grounded, and the other end thereof is connected to a terminal 92 of a "phono" switch 93. to a terminal 96 of a "radio" switch 97, to a terminal 98 of a "standby" switch 99, to terminals 100 and 101 of a "call" switch 102, and to terminals 103 and 104 of a "talk-listen" switch 105. These switches are the function switches of the master station.

A microphone transformer 106 is provided with a primary winding 107 having an end thereof connected to electrical ground, and having the other end thereof connected to a terminal 108 of the "phono" switch 93, and also connected to a terminal 109 of the "talk-listen" switch 105, and to a microphone input lead wire 111. A resistor 112 is connected across the primary winding 107 of transformer 106, to maintain a low-impedance input characteristic, and a capacitor 113 is connected across the secondary winding 114 of the transformer 106 to prevent high-frequency feedback. One end of the secondary winding 114 is electrically grounded, and the other end of this winding is connected, via a series combination of a capacitor 116 and resistor 117 for reducing microphone bass response and for providing electrical isolation of the amplifier input circuit, to the junction of the resistors 44 and 45 in the input circuit to the first transistor 48 of the audio-amplifier.

A contact arm 121 of the "phono" switch 93 is connected to a terminal 122 of the "radio" switch 97, and is adapted to alternatively connect to the terminals 108 and 92 of the "phono" switch 93. Another contact arm 123 of the "phono" switch 93 is connected to one of a pair of "phono input" terminals 124, the other terminal of which is electrically grounded. The contact arm 123 is mechanically ganged to the contact arm 121, and is adapted to alternatively engage an electrically grounded terminal 126 and a terminal 127 which is connected, via a series combination of a resistor 128 and a capacitor 129 to provide electrical impedance isolation, to the audio-amplifier input terminal 16. The "phono" switch 93 is shown in the position for non-use of a phonograph.

A contact arm 131 of the "radio" switch 97 is connected to a terminal 132 of the "standby" switch 99, and is adapted to alternatively contact the terminals 122 and 96. Another contact arm 133 of the switch 97 is mechanically coupled to the contact arm 131, and is connected to the voltage terminal 37 and is adapted to alternatively contact the terminal 134 which is connected to electrical ground via a resistor 136, and a terminal 137 which is connected to the operating voltage input wire 138 of the radio tuner 11. The "radio" switch 99 is shown in the position for non-use of the radio tuner 11.

The contact arm 141 of the "standby" switch 99 is connected to a terminal 142 of the "call" switch 102, and is adapted to alternatively contact the terminals 132 and 98. This switch 99 is shown in the non-standby position; when in "standby" position, i.e., with the contact arm connected to the terminal 98, the system is in condition for any remote station to talk to the master station, and for any remote station to talk to any desired remote stations, as will be described.

A contact arm 143 of the "call" switch 102 is connected to a terminal 144 of the "talk-listen" switch 105, and is adapted to alternatively contact the terminals 142 and 101. Another contact arm 145 of the switch 102 is connected, via a series combination of a resistor 147 and a capacitor 148, to the base electrode 57 of the second amplifier transistor 58, and is mechanically coupled to the contact arm 143 and is adapted to alternatively contact an unconnected terminal 149 and the terminal 100. The "call" switch 102 is shown in the non-calling position.

A contact arm 151 of the "talk-listen" switch 105 is connected to a transmission-reception signal wire 152, and is adapted to alternatively contact the terminals 144 and 103. A second contact arm 153 of the switch 105 is connected to the terminal 104, is mechanically coupled to the contact arm 151, and is adapted to alternatively contact an unconnected terminal 154 and a terminal 156 which is connected, via the resistance element of a potentiometer 157, to electrical ground. A further contact arm 158 of the switch 105, is connected to a terminal of a master station loudspeaker 159, a remaining terminal of the loudspeaker 159 being connected to electrical ground. The contact arm 158 is mechanically coupled to the contact arms 153 and 151, and is adapted to alternatively contact the terminal 109 and a terminal 159' which is connected to a tap 161 on the potentiometer resistance element 157. The "talk-listen" switch is shown in the "listen" position.

The above-described switches 93, 97, 99, 102, and 105 preferably are mechanically interconnected so that when any of these switches is thrown to its alternate position to that shown in the drawing, any of the other switches that were in this alternate position, are automatically released and return to the position shown in the drawing. Also, preferably, the switches 93, 97, and 99 are self-latching types which, when put in their alternate positions, remain in that position until released. The switches 102 and 105 preferably are of the type which will remain in the alternate position only as long as manually held there.

Control switches 166 through 170 are provided at the master station, for controlling the electrical connections between the master station and remotely located stations, as will now be described. The knob, slide lever, or other manually actuating means of each of the control switches, has three positions: (1) for transmission from the master station to the remote station associated with the particular control switch, which is the position shown in the drawing for these switches; (2) for electrically inactivating or turning "off" the remote station; and (3) for transmission from the remote station to the master station. The control switches 166 through 170 are identical, and as many of these switches as desired may be provided and connected as are the five control switches shown in the drawing. Taking the control switch 166 as exemplary, a control switch comprises a pair of slidable contact bars 176 and 177 mechanically ganged together and arranged to slide in unison in a direction along the axes, as indicated by the arrow 178.

When the switch 166 is in the condition for transmission from the master station to a remote station, as shown, the conductive contact bar 176 contacts terminals 181 and 182, and the conductive contact bar 177 contacts terminals 183 and 184. When the switch 166 is in the condition to inactivate the remote speaker, i.e., in the "off" condition, the contact bars 176 and 177 are slid in the direction indicated by the arrow 178, so that the bar 176 contacts the terminal 182 and a terminal 186 and the bar 177 contacts the terminal 184 and a terminal 187. When the switch 166 is in the condition for transmission from the remote station to the master station, the contact bars 176 and 177 are moved farther in the direction indicated by the arrow 178, so that bar 176 contacts terminal 186 and a terminal 188, and bar 177 contacts terminal 187 and a terminal 189.

The terminal 181 is not connected externally of the switch 166. Terminals 182 and 188 are connected together and are connected to the lead wire 152, through a resistor 191'. The terminal 186 is connected to electrical ground. Terminal 183 is connected to the lead wire 152. The terminals 184 and 187 are connected together and to a wire 191 which is to be connected to a remote station as will be described, and for convenience, is marked "B" indicating that it may be a black color. The terminals 189 is connected to the lead wire 111, and also is connected to a wire 192 for connection to a remote station, marked "W" indicating, for convenience, that it may be a white color. A third lead wire 193, for connection to a remote station, is electrically grounded as shown.

Now referring to FIGS. 2 and 3, which show schematic diagrams of two of a plurality of identical remote stations each remote station comprises three components: a loudspeaker-microphone 201, a "listen-talk" switch 202, shown in the "listen" position, and a listening level volume control 203. The loudspeaker 201 has a terminal connected to a connection lead wire 204 adapted to be connected to electrical ground, or to the ground wire 193 of one of the master station control switches 166, etc., and also connected to an end of the volume control potentiometer 203, the remaining end of the potentiometer 203 being connected to a contact arm 206 of the switch 202. The remaining terminal of the loudspeaker-microphone 201 is connected to a contact arm 207 of the switch 202. The contact arms 206 and 207 are mechanically ganged together. The contact arm 206 is adapted to be alternatively connected to an unconnected contact terminal 208 and a contact terminal 209 which is connected to a lead wire 210 which, for convenience, is designated "B" to indicate a black-colored wire for connection to the "black" wire 191 of one of the switches 166, etc. The contact arm 207 is adapted to be alternatively connected to a terminal 211 which is connected to a lead wire 212, which, for convenience, is designated "W" to indicate a white-colored wire for connection to a "white" wire 192 of one of the switches 166, etc., and to a contact terminal 213 which is connected to an adjustable tap 214 on the potentiometer 203. The lead wires 204, 210, and 212, are adapted to be respectively connected to the lead wires 193, 191 and 192, respectively, of any one of the switching units 166 through 170 of the master station shown in FIG. 1. Preferably, the switch 202 is spring biased to the "listen" condition as shown. Any desired number of remote stations, such as shown in FIGS. 2 and 3, up to the number of control switches 166–170 of the master station, may thus be connected to the various lead wires of the control switches of the master station so that each remote station can be individually controlled by one of the control switches. If desired, two or more remote stations may be connected to a single control switch for simultaneous and identical control by the switch.

The operation of the system will now be described. The radio tuner 11, and the audio amplifier comprising the three transistors 48, 58, and 77 and the associated amplifier circuitry, may be conventional and their operation is well known.

The "function" switches 93, 97, 99, 102, and 105, function as follows. When the "phono" switch 93 is in its off or rest position, as shown, the phonograph input connection is electrically grounded by the contact arm 123, and the other contact arm 121 connects the microphone transformer input winding 107 to the terminal 122 and thence to the transmission-reception wire 152 provided the remaining function switches are in the rest position. When the "phono" switch 93 is turned on, the contact arm 123 connects the ungrounded phonograph signal terminal to the amplifier input terminal 16, via capacitor 129 and resistor 128, whereby the phonograph signal will be amplified; and the contact arm 121 connects the amplifier output winding 91 to the transmission-reception wire 152, the remaining function switches being automatically in the "off" position when the phono switch is "on," whereby the amplified phono signal is fed to any remote stations that are in the "listen" condition as determined by the control switches 166, etc. being in the position shown in the drawing.

When the "radio" switch 97 is in its "off" position, as shown, the contact arm 133 connects a load resistor 136 between electrical ground and the voltage terminal 37 as a substitute for the tuner 11, and the contact arm 131 permits circuit continuity between the microphone transformer input winding 107 and the lead wire 152. When in the "on" position, the contact arm 133 applies voltage from the terminal 37 to the tuner voltage input wire 138, whereby the tuner 11 will function, and the contact arm 131 connects the amplifier output winding 91 to the wire 152, whereby the amplied radio tuner signal is fed to any desired remote stations as determined by the control switches 166, etc.

When the "standby" switch is in the rest position as shown, it permits completion of a connection to the wire 152 from the function switches or from the microphone input winding 107, for proper operation of the system. When the "standby" switch is turned on, the contact arm 141 connects the amplifier output winding 91 to the wire 152, whereby a person at a remote station can, whenever desired, talk to any of the system stations which are in the "on" condition as determined by the control switches 166, etc., by merely pressing the "talk-listen" switch 202 and then talking.

When the "call" switch 105 is in the rest position as shown, the contact arm 143 permits completion of a connection, as has been described, between the lead 152 and other circuits, and the contact arm 146 provides no function. When in the operative or "call" position, the contact arm 146 connects the audio output winding 91 to the base electrode 57 of amplifier transistor 58, via the resistor 147 and capacitor 148. This connection provides a positive feedback around a portion of the audio amplifier, causing an oscillation at a frequency determined primarily by the values of the feedback capacitor 148 (which may have a value of 0.02 microfarad, for example) and of the feedback resistor 147 (which may have a value of 50,000 ohms, for example) and at an amplitude or volume level determined primarily by the amplifier gain and by the relative values of the feedback resistor 147 and the input impedance of the transistor 58. As shown, the feedback is provided around two stages of a three-stage amplifier. Also, when in the "call" position the contact arm 143 connects the oscillator signal output from the output winding 91, to the line 152, whence the "call" signal tone is heard at the remote stations that are in the "on" condition as determined by the control switches 166, etc., thereby alerting persons within hearing distance of these remote stations that someone is to be called or an announcement is to be made. The frequency and amplitude of the call signal oscillation are chosen so as to provide a pleasant-sounding yet attention-getting call tone at the remote stations.

Simultaneously with the actuation of the "call" signal, the contact arm 143 breaks its contact with the terminal 142, so that any then occurring phono, radio, or voice transmission to the remote stations is immediately terminated, thereby further attracting attention and enabling the "call" signal tone to be more readily noticed. This is accomplished by locating the electrical connection of the "call" switch contact arm 143 between the line 152 and the contact arms 121, 131, and 141 of the "phono," "radio" and "standby" switches. The call tone sounds as long as the call switch is manually held in the "call" condition, which generally is only a few seconds, and by the time the call switch is released, any of the "phono," "radio," or "standby" switches 93, 97, 99 that had been "on," will automatically have returned to the "off" or rest position thereby placing the system in condition for voice communication.

When the "talk-listen" switch 105 is in the rest or "listen" position as shown, the contact arm 151 permits completion of a connection, as has been described, between the lead 152 and other circuits. The contact arms 153 and 158 connect the master station loudspeaker 159, for listening to the amplifier output winding 91, via the master speaker volume control potentiometer 157 whereby the volume level of the master speaker 159 may be individually adjusted. When in the "talk" position, the contact arm 104 disconnects the speaker 159 from the amplifier output winding 91; the contact arm 158 disconnects the speaker 159 from the potentiometer 157 and connects it to the line 111 and hence to the input winding 107 of the microphone transformer 106 whereby the speaker 159 can function as a microphone; and the contact arm 151 connects the amplifier output winding 91 to the line 152 and hence to remote speakers as selected by the control switches 166, etc., so that these remote speakers can reproduce the speech or other sounds applied to the speaker 159 now functioning as a microphone for talking while the switch 105 is held in the "talk" position as by manually pressing a button, and functions as a loudspeaker for listening when the switch is released to the "listen" condition as by ceasing to manually press a button.

The control switches 166, etc., function as follows, with reference to the switch 166 by way of example. When in the position shown, for communicating between the master station and one or more remote stations connected to the switch 166 by way of the lead wires 191–193, the contact bar 176 is not electrically operative, and the contact bar 177 connects the transmit-receive lead wire 152 to the "black" connecting wire 191 which in turn is connected to a "black" wire 210 of a remote station and hence to the terminal 209 of the remote "listen-talk" switch 202. The other wires 204 and 212 of the remote station being respectively connected to the wires 193 and 192 of the switch 166, the system is in condition for transmission from the master station to the remote stations thus connected, by actuating one of the "function" switches 93, 97, 99, 102, 105 at the master station, thus forming an electrical connection from the amplifier output winding 91, via wire 152, terminals 183 and 184, wire 191, wire 210, contact arm 206, volume control potentiometer 203, and contact arm 207, to the remote speaker 201, the electrical ground return being via wires 204 and 193. The transmitted signal also actuates the master station loudspeaker 159, via the contact arm 153 of switch 105, the potentiometer 157, and the contact arm 158.

Also, in this position of the control switch 166 as shown, a remote station can transmit to the master station, by actuating the remote "listen-talk" switch 202, thereby disconnecting the "listen" connection by means of the contact arm 206 and connecting the loudspeaker 201, now used as a microphone, via the contact arm 207, the leads 212 and 192, and the microphone lead wire 111, to the microphone transformer input winding 107, whereby the signal from the remote microphone 201 is amplified and applied from the amplifier output winding 91, via contact arm 153, volume control potentiometer 157, and the contact arm 158, to the master station loudspeaker 159.

For two-way communication, with the control switch 166 "on" as shown, the "talk-listen" switch 105 is actuated to the "talk" position when a person at the master station speaks, and then is released to the "listen" position whereupon a person at the remote station can talk to the master station, via contact arm 207, potentiometer 203, contact arm 206, wires 210 and 191, contact bar 177, wire 152, and the function switch contact arms 151, 143, 141, 131, and 121, to the microphone transformer input winding 107.

When the control switch 166 is placed in the "off" position, the bar 177 disconnects the "black" lead 191 from the signal wire 152, thereby disconnecting the remote station for listening, and the contact bar 176 connects the load resistor 191' between the signal wire 152 and electrical ground, this resistor 191' having a value equal to the load impedance of a remote station as determined primarily by the speaker and the remote volume control potentiometer 203. Thus, the impedance load on the output of the amplifier is approximately constant irrespective of how many remote stations are connected to the system at any time, resulting in uniform and proper impedance matching and signal amplitude in the system at all times. In this condition, in which the remote station is "off" with respect to receiving from the master station, the remote station can talk to the master station, as described above, when the remote station switch 202 is actuated.

When the control switch 166 is in the condition for listening to or monitoring a remote station, the bar 176 connects the load resistor 191 between the signal wire 152 and ground, for the reason described above, and the bar 177 connects the "black" wire 191' to the microphone transformer input winding 107, whereby the remote speaker 201, to be used as a microphone, becomes connected to the microphone transformer input winding 107 via the remote volume control potentiometer 203. Thus, the master station can continuously listen to any remote stations that are turned on, for purposes of monitoring or listening to sounds from the rooms of infants or sick persons, or for prowler detection, etc.

The volume control potentiometer 157 at the master station, and the volume control potentiometers 203 at the remote stations, are always connected into the circuit when the associated speaker is in the listening condition, whereby the volume is individually adjustable to a desired level at each speaker. However, when a speaker is used as a microphone at a station initiating the call by actuation of its "talk" switch 105 or 202, the volume control is disconnected automatically by the switch and the full-amplitude microphone signal is applied to the amplifier. This helps to insure proper communication, and avoids any necessity for manipulating the volume control to a different setting when talking than when listening.

To accomplish the above-described uniform loading of the intercommunication system's amplifier, each of the load resistors 191' is connected to a respective control switch 166, etc., as shown, so as to be connected across the amplifier output only when the control switch is in a position for disconnecting a remote station from the "send-receive" signal wire 152 and when a function switch 93, etc., is "on" for connecting the amplifier output winding 91 to the signal wire 152.

As mentioned above, the choice of resistance value for the load resistor 191' depends on the resistance values of the potentiometer 203 and the loudspeaker 201. The value of load resistance should be between the resistance values of the potentiometer 203 and loudspeaker 201. For example, if the potentiometer 203 has a resistance of 80 ohms and the loudspeaker 201 has a value of 8 ohms, a load resistance value of 12 ohms provides a satisfactory average equalization of loading on the amplifier output.

While a preferred embodiment of the invention has been shown and described, other embodiments will be apparent to persons skilled in the art and will be within the scope of the invention as defined by the following claims.

What I claim is:

1. A load circuit for an intercommunication system having an audio amplifier and a plurality of remote stations adapted to be selectively connected to a signal output line of the amplifier by means of a plurality of control switches, comprising a load resistor and switching means forming a part of each of said control switches, each of said switching means having reception, inactivation, and transmission positions with said switching means connecting the associated load resistor into said circuit through said signal output line in lieu of the associated remote station whenever the associated control switch is in the inactivation and the transmission positions which disconnects the remote station from the signal output line.

2. A circuit as claimed in claim 1, in which at least one of said remote stations comprises a potentiometer having a first given impedance value and a loudspeaker adapted to be connected across a portion of said potentiometer and having a second given impedance value that is lower than said first given impedance value, the resistance value of said load resistor that is associated with said one remote station being between said first and second given impedance values.

3. An intercommunication circuit comprising a signal output wire, a signal input wire, a remote station signal wire, a three position switch adapted to connect said remote station signal wire to said signal output wire when in a first position, to disconnect said remote station signal wire from said signal output wire when in a second position, and to connect said remote station signal wire to said signal input wire when in a third position, a load resistor, and switch means adapted to selectively connect said load resistor into said circuit through said signal output wire when said three position switch is in either of its said second and third positions.

References Cited by the Examiner

UNITED STATES PATENTS

| | | | |
|---|---|---|---|
| 2,149,637 | 3/1939 | Smith | 179—1.1 |
| 2,377,672 | 6/1945 | Campbell | 179—1.4 X |

KATHLEEN H. CLAFFY, *Primary Examiner.*

ROBERT H. ROSE, *Examiner.*

S. J. BOR, *Assistant Examiner.*